US010253549B2

(12) United States Patent
Messere et al.

(10) Patent No.: US 10,253,549 B2
(45) Date of Patent: Apr. 9, 2019

(54) INSULATED GLAZING UNITS AND ELECTRICAL FEED THROUGHS

(71) Applicant: SAGE ELECTROCHROMICS, INC., Faribault, MN (US)

(72) Inventors: Rino Messere, Modave (BE); Christian Müller, Marburg-Bauerbach (DE); Robert J. Anglemier, Waterville, MN (US); Bryan D. Greer, Northfield, MN (US); Clifford Lee Taylor, Northfield, MN (US)

(73) Assignee: SAGE ELECTROCHROMICS, INC., Faribault, MN (US)

( * ) Notice: Subject to any disclaimer, the term of this patent is extended or adjusted under 35 U.S.C. 154(b) by 0 days.

(21) Appl. No.: 15/380,016

(22) Filed: Dec. 15, 2016

(65) Prior Publication Data

US 2017/0167186 A1 Jun. 15, 2017

Related U.S. Application Data

(60) Provisional application No. 62/267,659, filed on Dec. 15, 2015.

(51) Int. Cl.
*E06B 3/663* (2006.01)
*E06B 3/673* (2006.01)
*H05K 1/18* (2006.01)

(52) U.S. Cl.
CPC ...... *E06B 3/66309* (2013.01); *E06B 3/66314* (2013.01); *E06B 3/673* (2013.01); *H05K 1/189* (2013.01); *H05K 2201/10151* (2013.01)

(58) Field of Classification Search
CPC .. E06B 3/66309; E06B 3/66314; E06B 3/673; H05K 1/189
(Continued)

(56) References Cited

U.S. PATENT DOCUMENTS

| 4,613,530 | A |   | 9/1986 | Hood et al. |
| 5,219,640 | A | * | 6/1993 | Gazit ............... H05K 1/028 |
|           |   |   |        | 174/250 |

(Continued)

FOREIGN PATENT DOCUMENTS

WO 2009112216 A1 9/2009

OTHER PUBLICATIONS

International Search Report for PCT/US16/66854, dated Apr. 4, 2017, 1 page.

*Primary Examiner* — Timothy Thompson
*Assistant Examiner* — Charles Pizzuto
(74) *Attorney, Agent, or Firm* — Abel Law Group, LLP; Robert N. Young

(57) ABSTRACT

An insulated glazing unit can include a spacer frame disposed between a first substrate from a second substrate and forming a portion of a sealed boundary and a flexible circuit extending through the sealed boundary. In an embodiment, the flexible circuit includes a flexible ribbon having a total length, $L_A$, and an effective length, $L_E$, and wherein $L_E$ is less than $L_A$. In another embodiment, the flexible circuit includes an expandable portion adapted to expand a length of the flexible circuit to accommodate: relative movement between two or more portions of the insulated glazing unit, resizing of one or more portions of the insulated glazing unit, or any combination thereof.

20 Claims, 4 Drawing Sheets

(58) Field of Classification Search
USPC .......................................................... 174/749
See application file for complete search history.

(56) References Cited

U.S. PATENT DOCUMENTS

| | | | |
|---|---|---|---|
| 5,784,853 A | 7/1998 | Hood et al. | |
| 9,142,945 B2* | 9/2015 | Snyker | H02G 3/22 |
| 2008/0139909 A1* | 6/2008 | Corl | A61B 5/14539 |
| | | | 600/345 |
| 2012/0190791 A1* | 7/2012 | Chan | C08F 2/44 |
| | | | 524/707 |
| 2013/0059629 A1* | 3/2013 | Takagi | H04M 1/0237 |
| | | | 455/566 |
| 2013/0157493 A1 | 6/2013 | Brown | |
| 2013/0319756 A1* | 12/2013 | Snyker | H02G 3/22 |
| | | | 174/650 |
| 2014/0000191 A1 | 1/2014 | Snyker et al. | |
| 2016/0101287 A1* | 4/2016 | Perryman | A61N 1/36071 |
| | | | 607/46 |
| 2016/0291244 A1* | 10/2016 | Trutna | G02B 6/002 |
| 2017/0268287 A1* | 9/2017 | Miller | E06B 3/6775 |

* cited by examiner

INSULATED GLAZING UNITS AND ELECTRICAL FEED THROUGHS

CROSS-REFERENCE TO RELATED APPLICATION(S)

This application claims priority under 35 U.S.C. § 119(e) to U.S. Patent Application No. 62/267,659 entitled "INSULATED GLAZING UNITS AND ELECTRICAL FEED THROUGHS," by Rino Messere, Christian Müller, Robert J. Anglemier, Bryan D. Greer and Clifford Lee Taylor, filed Dec. 15, 2015, which is assigned to the current assignee hereof and incorporated herein by reference in its entirety.

FIELD OF THE DISCLOSURE

The present disclosure relates to insulated glazing units, and more particularly, to electrical feed through devices for operating the insulated glazing units.

RELATED ART

Insulated glazing units may be fabricated with an electrical feed extending from an exterior environment to an insulated interior of the insulated glazing unit to permit operation of the insulated glazing unit. More tolerant feed through solutions are desired.

BRIEF DESCRIPTION OF THE DRAWINGS

Embodiments are illustrated by way of example and are not limited in the accompanying figures.

Figure 1:
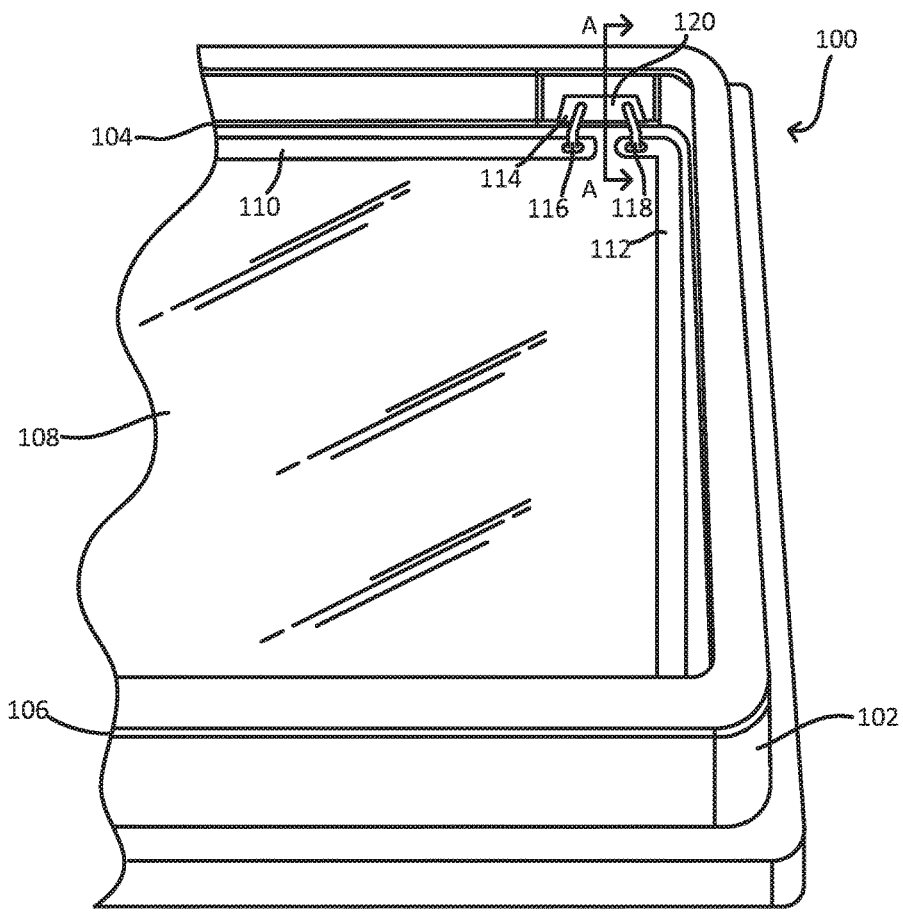
FIG. 1 includes a perspective view of a portion of an insulated glazing unit in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, the terms "vertical," "horizontal," and "lateral" are intended to refer to directional orientations as they relate to the orientations illustrated in the figures.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the insulated glazing and electrochromic arts.

Insulated glazing units in accordance with embodiments described herein can generally include a spacer frame disposed between first and second substrates. The spacer frame can be part of a sealed boundary, insulating a sealed internal space of the insulated glazing unit from an external environment. A flexible circuit can extend through the sealed boundary, passing from the internal space of the insulated glazing unit to the external environment. In an embodiment, the flexible circuit can be coupled to a conductive element, such as a bus bar, within the internal space of the insulated glazing unit. One or more elements can connect with the flexible circuit in the external environment, permitting operational control of the insulated glazing unit. In a particular embodiment, the flexible circuit can include a flexible ribbon having a total length, $L_A$, as measured along a surface of the flexible ribbon, and an effective length, $L_E$, as measured by a straight line extending between two furthest apart longitudinal positions of the flexible ribbon, where $L_E$ is less than $L_A$. In a further embodiment, the flexible ribbon can include an expandable portion such as a crease, a crumpled portion, a folded portion, a deformed portion, or any combination thereof, which can expand the effective length of the flexible ribbon when force is applied to or along the flexible ribbon. In a particular instance, force may be applied to the flexible ribbon as a result of thermal gradients within the insulated glazing unit or contact with materials having different coefficients of thermal expansion which expand and contract at different rates and temperatures. That is, relative movement between components of the insulated glazing unit, resizing of components therein, or a combination thereof, either in a completed assembly or during the manufacturing process, may result in changing distances over which the flexible circuit may be required to span. Expandable portions of the flexible circuit in accordance with embodiments described herein can accommodate variable spans without damaging components located in inaccessible portions of the insulated glazing unit and without breaking or detaching the flexible circuit from components located within the internal space of the insulated glazing unit.

FIG. 1 includes an illustration of a portion of an insulated glazing unit (IGU) 100. The IGU can include a spacer 102 and seals 104 and 106 disposed on opposite sides of the spacer 102. The spacer 102 can include a material like metal such as stainless steel, aluminum, an alloy, or a polymer, a composite, foam, or any combination thereof. In an embodiment, the spacer 102 includes a hollow member, such as a hollow tube.

The seal 104 can be disposed on a substrate 108, such as a glass panel, with the spacer 102 disposed on an opposite side of the seal 104. The seal 106 can be disposed on the spacer 102 at a location opposite the seal 104. In an embodiment, the seals 104 and 106 can be formed from the same material. By way of a non-limiting example, the seals 104 and 106 can include polymeric material such as polyisobutylene (PIB), however, it is possible to use other materials for seals 104 and 106. The spacer 102 can be part of an overall spacer frame that may include other features or components. In a particular instance, the spacer frame can be relatively uniform as viewed along the sealed boundary of the IGU 100.

Conductors 110 and 112, such as bus bars, can extend along an interior surface of the substrate 108. The conductors 110 and 112 can extend across dimensions of the IGU, such as along a length or width thereof. Portions of the conductors 110 and 112 can lie along straight lines connected together at relative angles. Portions of the conductors 110 and 112 can also include arcuate portions. In a particular embodiment, the conductors 110 and 112 terminate near one another, permitting use of a single electrical feed through to provide power to both conductors 110 and 112. In another embodiment, the conductors 110 and 112 can be connected to different electrical feed throughs extending through the boundary at different locations. The conductors 110 and 112 transfer electrical current to dynamic glazings, such as electrochromic stacks, applied to the substrate 108. The electrical feed through, as discussed in greater detail below, permits introduction of the electrical current to the conductors 110 and 112.

In an embodiment, the conductors 110 and 112 are coupled to a flexible circuit feed through 114 (hereinafter referred to as the "flexible circuit") extending through a boundary of the IGU 100 formed by the spacer 102. The flexible circuit 114 can generally include a flexible ribbon 120 having a length, a width perpendicular to the length, and a thickness perpendicular to both the length and width. In a particular embodiment, the thickness of the flexible ribbon 120 is less than the width and the width is less than the length. In an embodiment, the flexible circuit 114 extends through the boundary of the IGU such that the length is perpendicular to the boundary.

The flexible circuit 114 can include traces 116 and 118 extending along the flexible ribbon 120. In an embodiment, the flexible circuit 114 can include a plurality of traces, such as at least two traces, at least three traces, or at least four traces. In a particular instance, at least one of the traces 116 and 118 may extend parallel with, or generally parallel with, the length of the flexible circuit 114. In an embodiment, the traces 116 and 118 may extend along the flexible ribbon 120 from an external environment to an insulated space contained within the IGU 100.

In an embodiment, the flexible circuit 114 can include a conductive substrate and a non-conductive coating disposed thereon. In a particular embodiment, the conductive substrate can be disposed along a neutral axis of bending, i.e., between layers of non-conductive coating having equal thickness. This can reduce the possibility of the conductive substrate breaking after being bent multiple times. In a particular instance, portions of the flexible circuit 114 can be free, or essentially free, of non-conductive coatings.

Figure 7:
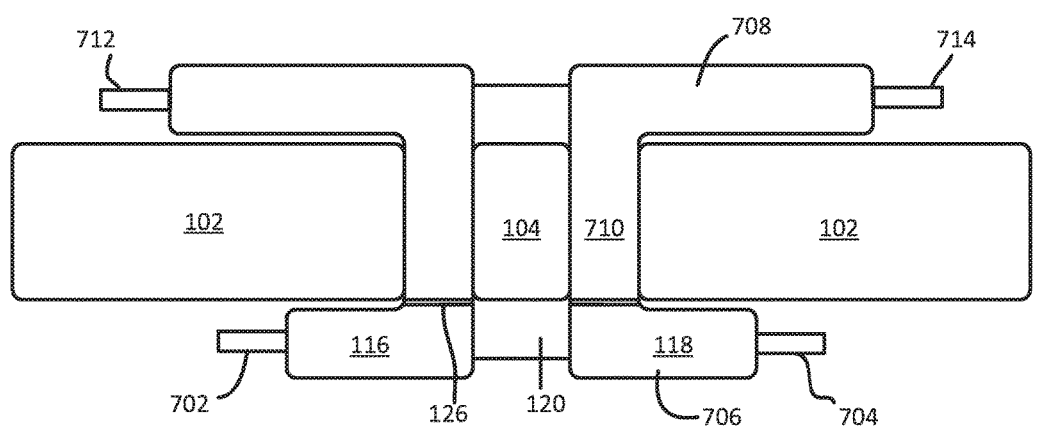
FIG. 7 includes a cut away top view of an insulated glazing unit as seen along a sealed boundary thereof in accordance with an embodiment.

Referring to FIG. 7, pins 702 and 704 at the ends of traces 116 and 118 can project from the flexible ribbon 120 within the insulated space. The pins can extend from the flexible ribbon 120 a distance such that alignment and electrical interconnection of the pins with the conductors 110 and 112 (FIG. 1) is more easily facilitated during assembly of the IGU. The pins 702 and 704 may be soldered, for example by means of ultrasonic or conventional soldering processes, to the conductors 110 and 112 (FIG. 1) using, for example, indium, tin, silver, silver alloy, or any combination thereof. Pins 712 and 714 can project from the traces 116 and 118 at the other side of the flexible ribbon 120 into the external environment. Pins 712 and 714 can be soldered to an external connection, for example, by means of ultrasonic or conventional soldering processes, with a material such as indium, tin, silver, silver alloy, or any combination thereof. In another embodiment, pins 712 and 714 can include conductive pads, such as copper pads, for external attachment.

The traces 116 and 118 can extend across the sealed boundary formed by the spacer 102 and seal 104. In an embodiment, at least one of the traces 116 and 118, such as both of the traces 116 and 118, have a C-shaped, or an approximately C-shaped, profile when viewed from a top view perpendicular to a major surface of the substrate 108. At least one of the traces 116 and 118 can include, for example, an inner segment 706 adapted to couple with, such as electrically couple with, one of the conductors 110 and 112, an outer segment 708, and a connection segment 710. The connection segment 710 can be disposed between the inner and outer segments 706 and 708 extending through the sealed boundary. In a particular embodiment, the inner and outer segments 706 and 708 can include lengths, as measured from the connection segment 710, that are different than one another. More particularly, the inner segment 706 can be shorter than the outer segment 708. As illustrated, at least one of the inner and outer segments can extend along a plane that intersects the connection segment at an approximately 90° angle. The relative size of the trace segments 706, 708, and 710 may be adjustable for differently shaped and sized IGUs.

Adhesive, such as pressure sensitive adhesive, can be disposed between portions of the flexible ribbon 120 and adjacent structures of the IGU. For example, in particular embodiments, adhesive can be positioned between the flexible ribbon 120 and the seal 104, between the flexible ribbon 120 and the spacer 102, between the flexible ribbon 120 and the substrate (not illustrated), or between any combination thereof.

Figure 2:
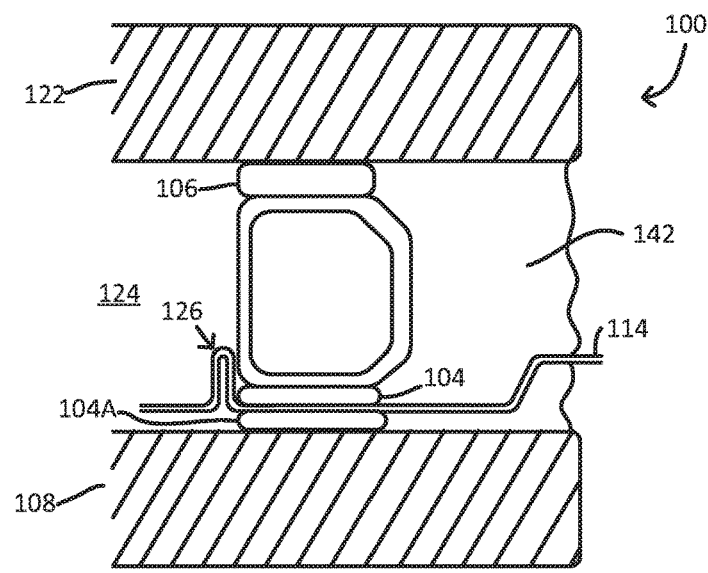
FIG. 2 includes a cross-sectional elevation view of the insulated glazing unit in accordance with an embodiment as seen along Line A-A in FIG. 1.

FIG. 2 illustrates a cross-sectional view of the IGU 100 as seen along Line A-A in FIG. 1. Seal 106 disposed opposite seal 104 may abut a substrate 122, forming an insulated space 124 of the IGU 100. An optional seal 142 disposed along an outer surface of the spacer 102 further insulates the IGU 100, reducing the likelihood of contaminant ingress. In an embodiment, the optional seal 142 can include a similar material as seals 104 and 106. In another embodiment, the optional seal 142 can include a different material. For example, the optional seal 142 can include polyisobutylene (PIB), butyl, ethylene vinyl, epoxides polyvinyl, silicone and blends thereof, polysulfide or polysulphide, thermoplastic polyurethane, thermoplastic polyurethane elastomer, polysulfone and blends thereof, styrene acrylonitrile, acrylonitrile styrene acrylate, or any combination thereof. In a particular embodiment, the seals 104 and 106 can include a sealant or further composition to assist in secondary sealing.

In an embodiment, the flexible circuit 114 can extend from the insulated space 124 to the exterior environment, passing through at least a portion of the seal 104. Seal 104 disposed along opposing major surfaces of the flexible circuit 114 can seal insulated space 124. In a particular instance, a portion of the seal 104A can be coupled to the flexible circuit 114 prior to assembly of the IGU. That is, the seal 104A may be integral to the flexible circuit 114.

In certain embodiments, the flexible circuit 114 can include an expandable portion 126. The expandable portion can be disposed along a portion of the flexible circuit 114 located within the insulated space 124. The expandable portion 126 can include a crease, a crumpled portion, a folded portion, a deformed portion, or any combination thereof which permits the flexible circuit to expand and contract in length.

Figure 3:
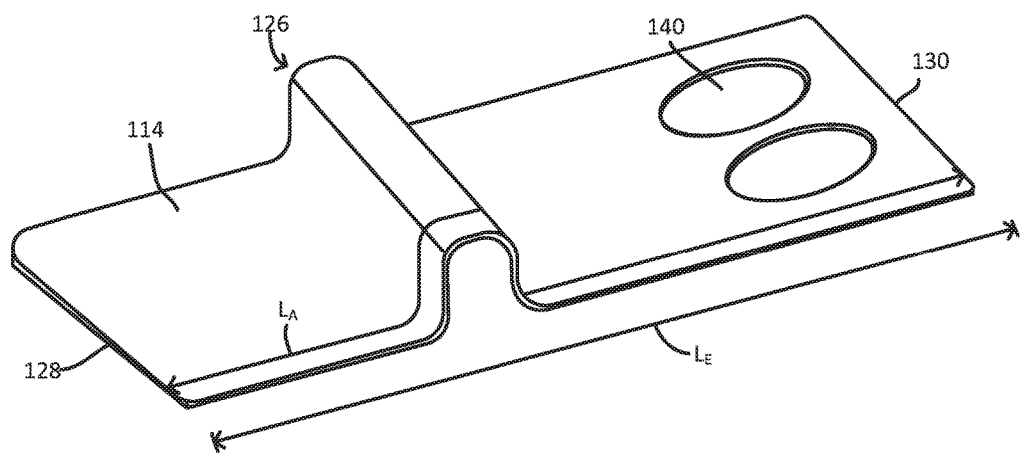
FIG. 3 includes a perspective view of a flexible circuit in accordance with an embodiment.

As illustrated in FIG. 3, the flexible circuit 114 can define a length, $L_A$, as measured along a surface of the flexible circuit 114 between opposite longitudinal ends 128 and 130. The flexible circuit 114 can also define an effective length, $L_E$, as measured along a line extending directly between longitudinal ends 128 and 130. In an embodiment, $L_E$ is less than $L_A$. More particularly, by way of non-limiting example, $L_E$ can be no greater than 0.995 $L_A$, no greater than 0.99 $L_A$, no greater than 0.95 $L_A$, no greater than 0.9 $L_A$, or no greater than 0.75 $L_A$. In an embodiment, $L_E$ is at least 0.1 $L_A$, at least 0.25 $L_A$, or at least 0.5 $L_A$. The difference between $L_A$ and $L_E$ can occur as a result of inclusion of the expandable portion 126.

As described above, the flexible circuit 114 can have a thickness less than the width and length. In a particular embodiment, the thickness of the flexible circuit 114 can be constant. That is, any two locations along the flexible circuit 114 can have the same thickness. In another embodiment, the thickness of the flexible circuit 114 can be non-uniform. For example, the flexible circuit 114 can have a first thickness at a first location and a second thickness different from the first thickness at a second location. In an embodiment, the flexible circuit 114 can have a thickness, $T_{EP}$, as measured at the expandable portion 126, less than a thickness, $T_O$, at other locations along the flexible circuit 114. In an embodiment $T_{EP}$ can be less than 0.99 $T_O$, less than 0.95 $T_O$, less than 0.9 $T_O$, less than 0.75 $T_O$, or less than 0.5 $T_O$. In another embodiment, $T_{EP}$ can be at least 0.01 $T_O$, less than 0.1 $T_O$, or less than 0.25 $T_O$. As the expandable portion 126 may permit adjustment of the effective length of the flexible circuit 114, material thickness of the expandable portion 126 may be reduced, allowing easier deformation thereof during application of applied forces along the flexible circuit 114. This may allow the expandable portion 126 to more readily deform at lower applied forces, making the IGU 100 more resilient to thermal gradients and less affected by materials having differing coefficients of thermal expansion. Moreover, a readily deformable expandable portion 126 can reduce the likelihood that solder connections or other conductive connections between leads and conductors within the IGU 100 break. In certain embodiments, the pins (previously described) can have a thickness greater than the flexible ribbon 120. This may allow easier soldering and attachment during manufacturing.

Figure 4:
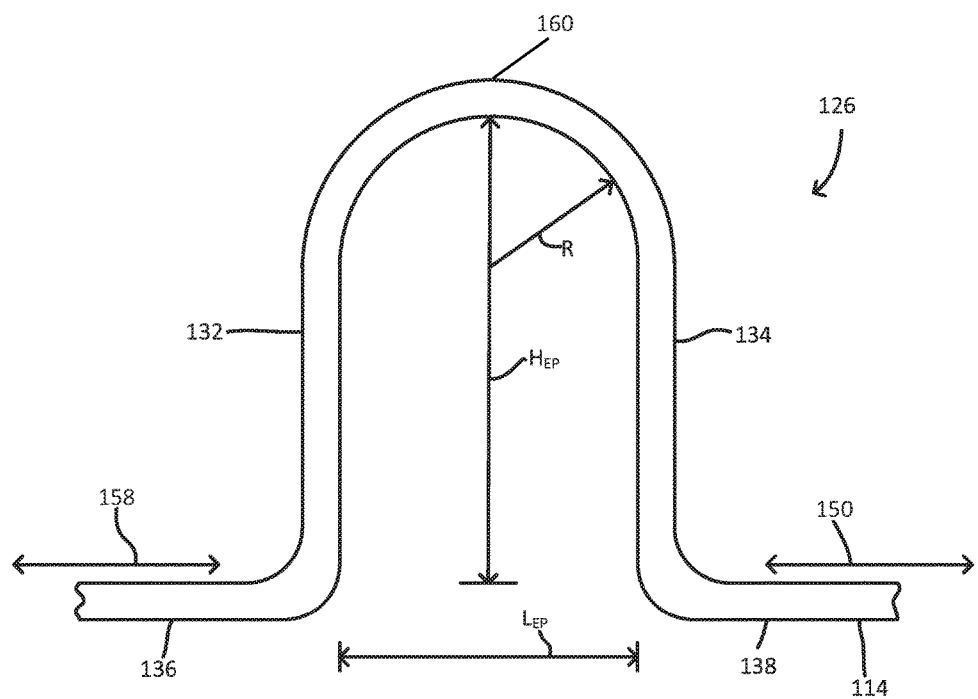
FIG. 4 includes a side-elevation view of an expandable portion of the flexible circuit in accordance with an embodiment.

FIG. 4 illustrates a cross-sectional view of the expandable portion 126 of the flexible circuit 114 in accordance with an embodiment. In a particular instance, the expandable portion 126 may expand the effective length, $L_E$, of the flexible circuit 114 by at least 1 mm, at least 2 mm, or even at least 3 mm. In a particular embodiment, the expandable portion 126 has a height, $H_{EP}$, of at least 0.01 mm, at least 0.05 mm, at least 0.1 mm, at least 0.5 mm, or at least 1 mm. In another embodiment, the height, $H_{EP}$, of the expandable portion 126 is no greater than 100 mm, no greater than 25 mm, or no greater than 5 mm. In a further embodiment, the expandable portion 126 has a length, $L_{EP}$, of at least 0.01 mm, at least 0.05 mm, at least 0.1 mm, at least 0.5 mm, or at least 1 mm. In yet another embodiment, the length, $L_{EP}$, of the expandable portion 126 is no greater than 100 mm, no greater than 25 mm, or no greater than 5 mm. In a particular instance, the height, $H_{EP}$, of the expandable portion 126 can be equal to the length, $L_{EP}$, thereof. In other instances, the height, $H_{EP}$, of the expandable portion 126 can be greater than the length, $L_{EP}$, thereof. In yet further instances, the height, $H_{EP}$, of the expandable portion 126 can be less than the length, $L_{EP}$, thereof.

As force is applied to the flexible circuit 114 in a direction generally corresponding with one or both of lines 158 and 150, the length of the expandable portion 126 can change. That is, the expandable portion 126 can have an initial length, as measured before application of force to the flexible circuit 114, and a modified length, as measured after or during application of force to the flexible circuit 114, where the initial length is different than the modified length. As force is applied along one or both of the opposite sides of the expandable portion 126, the length, $L_{EP}$, and height, $H_{EP}$, change. If the sum of forces is relatively outward (i.e., away from the expandable portion 126) the length, $L_{EP}$, of the expandable portion 126 increases while the height, $H_{EP}$, decreases. Conversely, if the sum of the forces is relatively inward (i.e., toward the expandable portion 126) the length, $L_{EP}$, of the expandable portion 126 decreases while the height, $H_{EP}$, increases. Traces 116 and 118 (FIG. 1) can deform with the expandable portion 126 of the flexible circuit 114, permitting monolithic flexure of the flexible circuit 114. In certain embodiments, the flexible circuit 114 may further exhibit flexure in the transverse direction (perpendicular to lines 158 and 150). That is, the flexible circuit 114 may be adapted to flex in transverse directions in response to transversely applied forces.

In certain embodiments, the expandable portion 126 can have a generally arcuate profile terminating in an upper apex, as viewed in cross section, defining a radius of curvature, R, of at least 0.1 mm, at least 0.5 mm, or even at least 1 mm. In an embodiment, R can be no greater than 10 mm. The arcuate expandable portion 126 can minimize stress on traces 116 and 118 during flexure. In other embodiments, the expandable portion 126 can include generally linear segments, as viewed in cross section, connected together at relative angles. While segments interconnected at relative angles may incur additional stress on the traces, space limitations within the insulated space of the IGU may require use of a flattened apex or polygonal segments connected together.

As illustrated, the expandable portion 126 includes two vertical portions 132 and 134, each extending from a lateral portion 136 and 138, and connected together at an arcuate portion 160. In a non-illustrated embodiment, the vertical portions 132 and 134 can be angularly offset from vertical.

Instead, the vertical portions 132 and 134 can form an acute or obtuse angle relative to the lateral portions 136 and 138, respectively. In a particular instance, use of vertical portions 132 and 134 forming acute angles relative to lateral portions 136 and 138, respectively, may permit greater lateral expansion of the expandable portion 126 while reducing possible lateral contraction. Conversely, use of vertical portions 132 and 134 forming obtuse angles relative to lateral portions 136 and 138, respectively, may permit greater lateral contraction of the expandable portion 126 while reducing possible lateral expansion.

In an embodiment, the expandable portion 126 can extend parallel to the width of the flexible circuit 114. In another embodiment, the expandable portion 126 can be angularly offset from the width of the flexible circuit 114 by at least 1°, at least 5°, at least 10°, at least 25°, or at least 60°. In a further embodiment, the expandable portion 126 can lie along at least two lines extending across the width of the flexible circuit 114. The at least two lines may include straight segments, arcuate segments, or combinations thereof. The at least two lines may intersect one another, creating an expandable portion 126 that does not lie along a single line. In certain embodiments, the expandable portion 126 can have a uniform cross-sectional profile as seen at all locations along the width of the flexible circuit 114. In other embodiments, the expandable portion 126 can have a varying cross-sectional profile such that the cross-sectional profile of the expandable portion 126 at a first location is different from a cross-sectional profile thereof at a second location. The cross-sectional profiles at the first and second locations may differ in size, shape, or a combination thereof. It is noted that varying the cross-sectional profiles too greatly can cause uneven movement of the expandable portion 126 which can result in rupture or excessive wear of the circuit. This in turn might result in electrical shorting or current leakage, reduced operating life expectancy, or diminished flexure upon application of loading conditions.

Referring again to FIG. 3, in accordance with an embodiment the flexible circuit 114 can further include an aperture 140 extending through the thickness of the flexible circuit 114. The aperture 140 can alter a physical property of the flexible circuit 114, providing the flexible circuit 114 with a desirable characteristic. For example, positioning of an aperture 140 along the expandable portion 126 may improve flexure of the expandable portion 126, making the flexible circuit 114 more sensitive to smaller forces. Alternatively, the aperture 140 can be positioned along the flexible circuit 114 so as to align with seal 104 or conductors 110 or 112. In an embodiment, the aperture 140 can include a plurality of apertures. Each aperture of the plurality of apertures can have the same or similar size, shape, or other suitable characteristic as compared to one another.

Referring again to FIG. 2, in a particular embodiment, the expandable portion 126 can create a lateral barrier for the spacer 102, reducing the likelihood that the spacer 102 contacts the conductor 110 or 112 which might otherwise short the conductor 110 or 112 or cause current leakage. During assembly, the seal 104 may be applied to the substrate 108. The seal 104 may optionally include the flexible circuit 114 integrally attached therewith. Alternatively, the flexible circuit 114 can be assembled relative to the seal 104 after or during installation of the seal 104. The spacer 102 (optionally including seal 106) can then be installed relative to the seal 104 and flexible circuit 114. As illustrated, the apex of the expandable portion 126 can extend to a vertical elevation above the seal 104. As used to describe the apex of the expandable portion 126, "vertical elevation above" refers to a state wherein the apex of the expandable portion 126 is disposed above an uppermost surface of the seal 104 when the IGU 100 is placed on a major surface of the substrate 108. During installation of the spacer 102, the apex of the expandable portion 126 can act as a tactile barrier, reducing the likelihood of improper spacer 102 positioning, particularly in the lateral directions.

Figure 5:
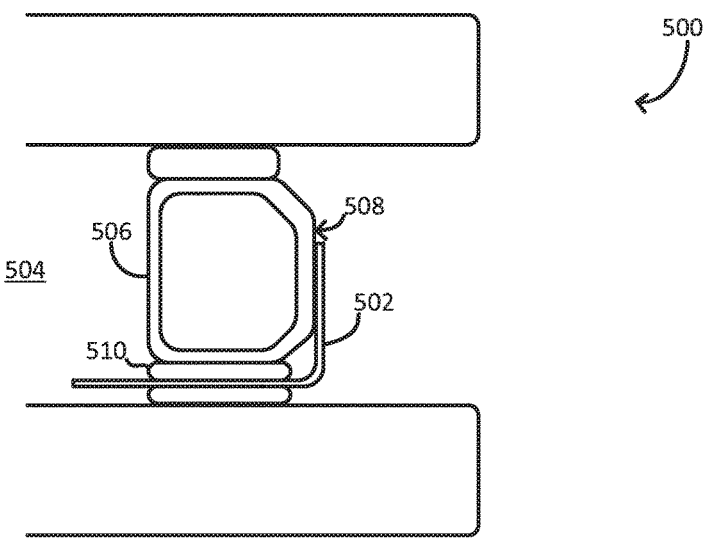
FIG. 5 includes a cross-sectional elevation view of an insulated glazing unit in accordance with an embodiment.

FIG. 5 illustrates an embodiment of the IGU 500 including a flexible circuit 502 extending from an internal space 504 of the IGU 500 between a spacer 506 and a seal 510 to an external environment. An end portion of the flexible circuit 502 can extend upward in the external environment. More specifically, the flexible circuit 502 can extend along an outer surface 508 of the spacer 506. Adhesive, mechanical fasteners, other suitable attachment processes, or combinations thereof can secure the end portion of the flexible circuit 502 at a location adjacent to the outer surface 508 of the spacer. In an embodiment, adhesive can be positioned along the flexible circuit 502 at locations adjacent to the spacer 506, the conductors 110 and 112 (FIG. 1), the seal 510, or any combination thereof. In a further embodiment, portions of the flexible circuit 502 between adhesive laden portions can be free, or essentially free, of adhesive. More particularly, the portions of the flexible circuit 502 between adhesive laden portions may not include adhesive.

Figure 6:
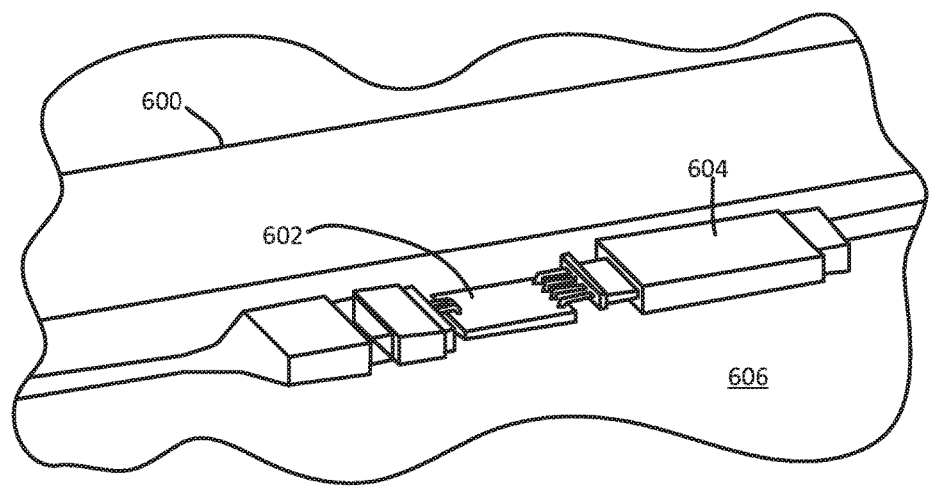
FIG. 6 includes a perspective view of a portion of an insulated glazing unit including an electrical component in accordance with an embodiment.

FIG. 6 illustrates an embodiment of an electrical component 602 coupled to a portion of the flexible circuit 604. The electrical component 602 can be positioned within an internal space 606 of the IGU 600 and provide identification information relating to a condition or property of the IGU 600. For example, the electrical component 602 can store product models or serial numbers, date of manufacture, device size or shape, device surface area, controllable parameters including maximum switching voltage or current for tinting or bleaching an electrochromic device, installation location, number and size of individually controllable segments, minimum and maximum tint levels, internal series resistance, another physical or operational parameter relating to the IGU 600, or any combination thereof. In an embodiment, the electrical component 602 can be connected to the flexible circuit 604 through one or more intermediary components such as couples, connectors, or electrical wires. In another embodiment, the electrical component 602 can be directly connected to the flexible circuit 604.

Many different aspects and embodiments are possible. Some of those aspects and embodiments are described below. After reading this specification, skilled artisans will appreciate that those aspects and embodiments are only illustrative and do not limit the scope of the present invention. Exemplary embodiments may be in accordance with any one or more of the embodiments as listed below.

EMBODIMENT 1

An insulated glazing unit comprising:
a spacer frame disposed between a first substrate from a second substrate and forming a portion of a sealed boundary; and
a flexible circuit extending through the sealed boundary, wherein the flexible circuit comprises a flexible ribbon having a total length, $L_A$, and an effective length, $L_E$, and wherein $L_E$ is less than $L_A$.

EMBODIMENT 2

An insulated glazing unit comprising:
a spacer frame disposed between a first substrate from a second substrate and forming a portion of a sealed boundary; and
a flexible circuit extending through the sealed boundary, wherein the flexible circuit comprises a flexible ribbon having an expandable portion adapted to expand a length of the flexible circuit to accommodate:
 relative movement between two or more portions of the insulated glazing unit;
 resizing of one or more portions of the insulated glazing unit; or
 any combination thereof.

EMBODIMENT 3

An insulated glazing unit comprising:
a spacer frame disposed between a first substrate from a second substrate and forming a portion of a sealed boundary; and
a flexible circuit extending through the sealed boundary, wherein the flexible circuit comprises a flexible ribbon and a pin extending from the flexible ribbon, and wherein the pin is adapted to align the flexible ribbon with a conductor within an inner area of the insulated glazing unit.

EMBODIMENT 4

An insulated glazing unit comprising:
a spacer frame disposed between a first substrate from a second substrate and forming a portion of a sealed boundary;
a flexible circuit extending through the sealed boundary and adapted to connect to a bus bar at an internal location of the insulated glazing unit; and
adhesive disposed along portions of the flexible circuit at locations adjacent to the spacer frame and the bus bars, wherein a portion of the flexible circuit between the bus bars and spacer frame does not include adhesive.

EMBODIMENT 5

An insulated glazing unit comprising:
a spacer frame disposed between a first substrate from a second substrate and forming a portion of a sealed boundary; and
a flexible circuit extending through the sealed boundary, wherein the flexible circuit comprises an expandable portion having a first thickness, and a non-expandable portion having a second thickness, and wherein the first thickness is different than the second thickness.

EMBODIMENT 6

A process of assembling an insulated glazing unit comprising:
 attaching a flexible circuit to a first substrate;
 coupling a first end of the flexible circuit to a bus bar;
 installing a spacer such that the flexible circuit is disposed between the spacer and the first substrate, wherein the flexible circuit includes a portion adapted to reduce a likelihood the spacer contacts the bus bar; and
 attaching a second substrate to the spacer opposite the first substrate.

EMBODIMENT 7

The insulated glazing unit or process of any one of the preceding embodiments, wherein the first and second substrates comprise glass, and wherein the spacer frame comprises a metal.

EMBODIMENT 8

The insulated glazing unit or process of any one of embodiments 1 and 3-7, wherein the flexible circuit comprises an expandable portion.

EMBODIMENT 9

The insulated glazing unit or process of any one of embodiments 2 and 8, wherein the expandable portion is adapted to expand an effective length of the flexible circuit by at least 1 mm, at least 2 mm, or at least 3 mm, wherein the expandable portion is adapted to expand the effective length of the flexible circuit by no greater than 20 mm, no greater than 10 mm, no greater than 5 mm, or no greater than 4 mm.

EMBODIMENT 10

The insulated glazing unit or process of any one of embodiments 2, 8, and 9, wherein the expandable portion comprises a bent portion of the flexible ribbon, wherein the bent portion extends a maximum distance from a planar portion of the flexible ribbon, wherein the maximum distance is at least 0.5 mm, at least 1 mm, or at least 1.5 mm, wherein the maximum distance is no greater than 10 mm, no greater than 5 mm, or no greater than 2 mm, wherein the bent portion has a length, as measured parallel to the planar portion of the flexible ribbon, and wherein the length is at least 0.1 mm, at least 0.5 mm, or at least 0.7 mm.

EMBODIMENT 11

The insulated glazing unit or process of any one of embodiments 2 and 8-10, wherein the expandable portion is adapted to expand an effective length of the flexible ribbon upon application of a force along the flexible ribbon, wherein the force applied to the flexible ribbon is related to a temperature differential or a difference in material coefficient of thermal expansion.

EMBODIMENT 12

The insulated glazing unit or process of any one of embodiments 1 and 11, wherein the effective length of the flexible ribbon is adapted to change as the insulated glazing unit exhibits relative internal movement, flexure, or resizing.

EMBODIMENT 13

The insulated glazing unit or process of any one of embodiments 1, 11, and 12, wherein the effective length, $L_E$, is no greater than a total length, $L_A$, of the flexible ribbon, as measured along a surface of the flexible ribbon without application of force along the flexible ribbon, wherein $L_E$ is no greater than 0.999 $L_A$, no greater than 0.95 $L_A$, or no greater than 0.9 $L_A$, wherein $L_E$ is no less than 0.1 $L_A$, no less than 0.5 $L_A$, or no less than 0.75 $L_A$.

EMBODIMENT 14

The insulated glazing unit or process of any one of embodiments 2 and 8-13, wherein the expandable portion comprises a crease, a crumpled portion, a folded portion, a deformed portion, or any combination thereof.

EMBODIMENT 15

The insulated glazing unit or process of any one of embodiments 1-4 and 6-14, wherein the flexible circuit comprises a thickness, wherein the thickness varies along the flexible circuit, wherein the flexible circuit has a first thickness at non-expandable portions thereof and a second thickness at an expandable portion, wherein the first thickness is greater than the second thickness.

EMBODIMENT 16

The insulated glazing unit or process of any one of the preceding embodiments, wherein the flexible circuit comprises a plurality of traces, wherein the plurality of traces includes at least two traces, at least three traces, or even at least four traces, wherein each of the traces includes a pin, wherein the flexible circuit comprises an aperture.

EMBODIMENT 17

The insulated glazing unit or process of any one of the preceding embodiments, wherein the flexible circuit comprises a composite construction, wherein the flexible circuit comprises a conductive substrate and a non-conductive layer disposed on the conductive substrate, wherein the non-conductive layer is an insulator such as polyimide, wherein the conductive substrate comprises copper, wherein the non-conductive layer comprises a polymer, wherein the conductive substrate has a thickness in a range between and including 1 µm and 1000 µm, wherein the non-conductive layer has a thickness in a range between and including 1 µm and 1000 µm.

EMBODIMENT 18

The insulated glazing unit or process of embodiment 17, wherein the non-conductive layer comprises a polymer, wherein the non-conductive layer comprises polyimide.

EMBODIMENT 19

The insulated glazing unit or process of any one of the preceding embodiments, wherein the flexible circuit comprises an interior portion disposed within the insulated glazing unit and an exterior portion disposed outside of the insulated glazing unit, and wherein an electrical component is coupled to the flexible circuit on the interior portion.

EMBODIMENT 20

The insulated glazing unit or process of embodiment 19, wherein the electrical component comprises an identifier, a sensor adapted to detect light, motion, or temperature, or any combination thereof.

EMBODIMENT 21

The insulated glazing unit or process of any one of the preceding embodiments, wherein the flexible circuit comprises a first trace and a second trace, both the first and second traces extending across the sealed boundary, wherein at least one of the first and second traces has a generally C-shape, wherein the first and second traces each have a generally C-shape, wherein at least one of the first and second traces comprises an inner segment, an outer segment, and a connection segment extending between the inner and outer segments, wherein the inner segment has a length less than a length of the outer segment, wherein the inner segment is adapted to couple with a bus bar.

EMBODIMENT 22

The insulated glazing unit or process of embodiment 21, wherein at least one of the inner and outer segments extends from the connection segment at an approximately 90° angle.

EMBODIMENT 23

The insulated glazing unit or process of any one of the preceding embodiments, wherein an outer portion of the flexible circuit is attached to an external side of the spacer by adhesive, a mechanical fastener, another suitable method, or any combination thereof, wherein the outer portion of the flexible circuit is attached to the external side of the spacer by a strip of adhesive.

EMBODIMENT 24

The insulated glazing unit or process of any one of the preceding embodiments, further comprising a seal, wherein a first portion of the seal is disposed between the flexible circuit and the spacer, and wherein a second portion of the seal is disposed between the flexible circuit and the first substrate.

EMBODIMENT 25

The insulated glazing unit or process of embodiment 24, wherein the seal comprises polyisobutylene (PIB).

EMBODIMENT 26

The insulated glazing unit or process of any one of the preceding embodiments, wherein the flexible circuit comprises a first adhesive and a second adhesive, wherein the first adhesive is near opposite ends of the flexible circuit, wherein the second adhesive is disposed along the flexible circuit at a location adjacent to the spacer, wherein the first adhesive is spaced apart from the second adhesive by an adhesiveless portion.

EMBODIMENT 27

The insulated glazing unit or process of any one of the preceding embodiments, further comprising:
 a secondary seal disposed between the first and second substrate to an external side of the spacer frame.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

The invention claimed is:

1. An insulated glazing unit comprising:
   a spacer frame disposed between a first substrate from a second substrate and forming a portion of a sealed boundary;
   a flexible circuit extending through the sealed boundary, wherein the flexible circuit comprises a flexible ribbon having a total length, $L_A$, and an effective length, $L_E$, and wherein $L_E$ is less than $L_A$;
   wherein the flexible circuit comprises an expandable portion and wherein the expandable portion has a height $H_{EP}$ and a length $L_{EP}$; and
   wherein the height $H_{EP}$ is greater than the length $L_{EP}$.

2. The insulated glazing unit of claim 1, wherein the first and second substrates comprise glass, and wherein the spacer frame comprises a metal.

3. The insulated glazing unit of claim 1, wherein the expandable portion has a height $H_{EP}$ of at least 0.1 mm.

4. The insulated glazing unit of claim 3, wherein the expandable portion has a length $L_{EP}$ of at least 0.01 mm.

5. The insulated glazing unit of claim 1, wherein the expandable portion comprises a bent portion of the flexible ribbon that extends a maximum distance of at least 0.5 mm from a planar portion of the flexible ribbon.

6. The insulated glazing unit of claim 1, wherein the expandable portion is adapted to expand an effective length of the flexible ribbon upon application of a force along the flexible ribbon.

7. The insulated glazing unit of claim 1, wherein the effective length of the flexible ribbon is adapted to change as the insulated glazing unit exhibits relative internal movement, flexure, or resizing.

8. The insulated glazing unit of claim 1, wherein $L_E$ is no less than 0.1 $L_A$.

9. The insulated glazing unit of claim 1, wherein the flexible circuit comprises a thickness that varies along the flexible circuit including a first thickness at non-expandable portions thereof and a second thickness at an expandable portion, wherein the first thickness is greater than the second thickness.

10. The insulated glazing unit of claim 1, wherein the flexible circuit comprises a composite construction comprising a conductive substrate and a non-conductive layer disposed on the conductive substrate.

11. The insulated glazing unit of claim 3, wherein the expandable portion has a height $H_{EP}$ of no greater than 100 mm.

12. The insulated glazing unit of claim 10, wherein the non-conductive layer comprises polyimide.

13. The insulated glazing unit of claim 1, wherein the flexible circuit comprises an interior portion disposed within the insulated glazing unit and an exterior portion disposed outside of the insulated glazing unit, wherein an electrical component is coupled to the flexible circuit on the interior portion, and wherein the electrical component comprises an identifier, a sensor adapted to detect light, motion, or temperature, or any combination thereof.

14. The insulated glazing unit of claim 1, wherein the expandable portion is configured to create a lateral barrier between the spacer frame and a conductor.

15. The insulated glazing unit or process of claim 14, wherein the conductor is a bus bar.

16. The insulated glazing unit of claim 1, wherein the flexible circuit comprises a first adhesive and a second adhesive, wherein the first adhesive is near opposite ends of the flexible circuit, wherein the second adhesive is disposed along the flexible circuit at a location adjacent to the spacer, wherein the first adhesive is spaced apart from the second adhesive by an adhesiveless portion.

17. The insulated glazing unit of claim 1, further comprising:
   a secondary seal disposed between the first and second substrate to an external side of the spacer frame.

18. An insulated glazing unit comprising:
   a spacer frame disposed between a first substrate from a second substrate and forming a portion of a sealed boundary; and
   a flexible circuit extending through the sealed boundary and adapted to connect to a bus bar at an internal location of the insulated glazing unit, wherein the flexible circuit comprises a flexible ribbon having an expandable portion adapted to expand a length $L_{EP}$ of the flexible circuit to accommodate:
      relative movement between two or more portions of the insulated glazing unit;
      resizing of one or more portions of the insulated glazing unit; or
      any combination thereof.

19. An insulated glazing unit comprising:
   a spacer frame disposed between a first substrate from a second substrate and forming a portion of a sealed boundary;
   a flexible circuit extending through the sealed boundary, wherein the flexible circuit comprises a flexible ribbon having a total length, $L_A$, and an effective length, $L_E$, and wherein $L_E$ is less than $L_A$; and
   wherein the flexible circuit comprises a first adhesive and a second adhesive, wherein the first adhesive is near opposite ends of the flexible circuit, wherein the second adhesive is disposed along the flexible circuit at a location adjacent to the spacer, wherein the first adhesive is spaced apart from the second adhesive by an adhesiveless portion.

20. The insulated glazing unit of claim 18, wherein the expandable portion has a length $L_{EP}$ of no greater than 25 mm.

* * * * *